United States Patent
Fujii et al.

[11] Patent Number: 5,882,418
[45] Date of Patent: Mar. 16, 1999

[54] JIG FOR USE IN CVD AND METHOD OF MANUFACTURING JIG FOR USE IN CVD

[75] Inventors: Atsuhiro Fujii; Kazuo Kobayashi; Yasuhiko Horie; Hiroshi Ohnishi; Seiichi Mimura, all of Tokyo, Japan

[73] Assignee: Mitsubishi Denki Kabushiki Kaisha, Tokyo, Japan

[21] Appl. No.: 905,396

[22] Filed: Aug. 4, 1997

[30] Foreign Application Priority Data

Mar. 7, 1997 [JP] Japan ..................................... 9-070824

[51] Int. Cl.⁶ ..................................................... C23C 16/00
[52] U.S. Cl. ............................................................ 118/728
[58] Field of Search ............................................. 119/728

[56] References Cited

U.S. PATENT DOCUMENTS

| | | | |
|---|---|---|---|
| 3,226,254 | 12/1965 | Reuschel | 118/728 |
| 4,566,839 | 1/1986 | Butler | 118/728 |
| 5,169,684 | 12/1992 | Takagi | 118/728 |
| 5,192,371 | 3/1993 | Shuto | 118/728 |
| 5,534,074 | 7/1996 | Koons | 118/728 |
| 5,595,604 | 1/1997 | Kobayashi | 118/728 |

FOREIGN PATENT DOCUMENTS

| | | |
|---|---|---|
| 52-77590 | 6/1977 | Japan . |
| 55-68621 | 5/1980 | Japan . |
| 56-76240 | 6/1981 | Japan . |
| 62-134936 | 6/1987 | Japan . |

*Primary Examiner*—Richard Bueker
*Attorney, Agent, or Firm*—Oblon, Spivak, McClelland, Maier & Neustadt, P.C.

[57] ABSTRACT

It is an object to improve the corrosion resistance of a CVD jig made of quartz to prevent exfoliation of a film attached on the surface to prevent dust. The surface of a quartz CVD jig is burned with an arc plasma torch 14 so that the OH concentration in the quartz surface remains under 30 ppm.

5 Claims, 11 Drawing Sheets

JIG FOR USE IN CVD AND METHOD OF MANUFACTURING JIG FOR USE IN CVD

BACKGROUND OF THE INVENTION

1. Field of the Invention

The present invention relates to jigs for use in CVD for film formation, low pressure CVD methods using the same, and methods of manufacturing the CVD jigs, and particularly to a jig made of quartz for use in CVD, a low pressure CVD method using it, and a method of manufacturing the low pressure CVD jig.

2. Description of the Background Art

Figure 12:
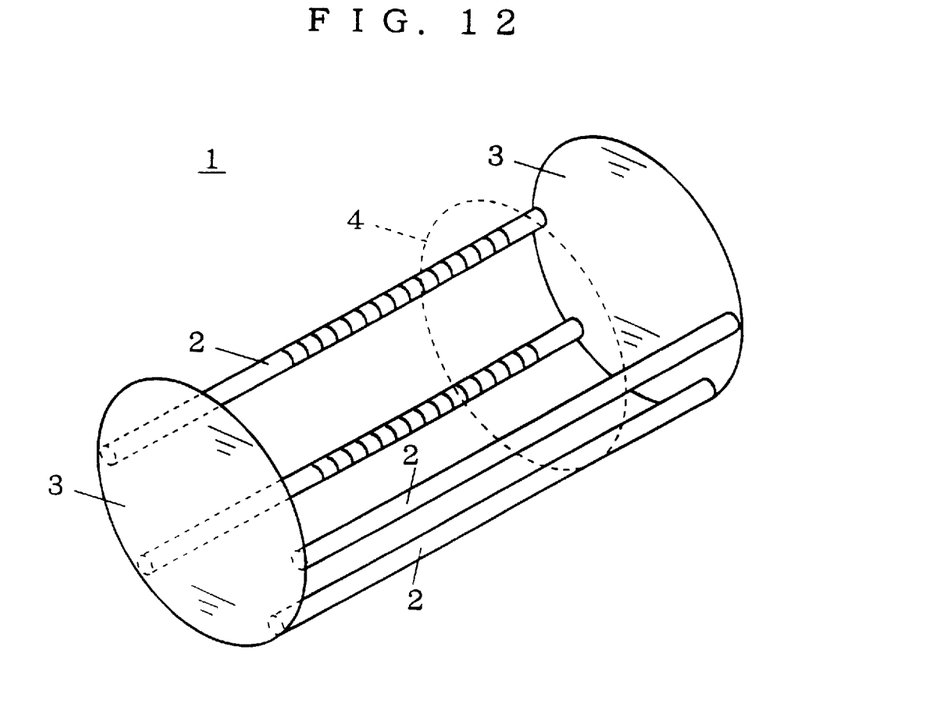
FIG. 12 is a perspective view showing the structure of a CVD jig.
Figure 13:
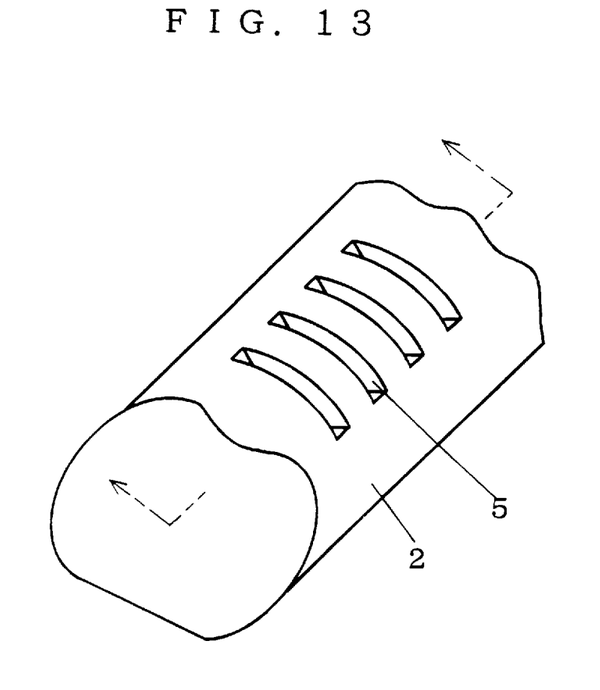
FIG. 13 is a perspective view showing the structure of the conventional wafer supporting member.

FIG. 12 is a perspective view showing the structure of a quartz boat. The quartz boat 1 is formed of three or more (four in this diagram) wafer supporting members 2 for supporting wafers 4 and quartz plates 3 for standing the wafer supporting members 2. The wafer 4 shown by the dotted line is placed in grooves of the wafer supporting members 2. Since contamination of the wafers 4 is undesirable, the wafer supporting members 2 are formed of quartz as well. For example, the contaminants include metal such as sodium, iron, etc. FIG. 13 is a diagram showing, in an enlarged manner, part of the wafer supporting member 2 in FIG. 12. The wafers are placed in the grooves 5.

Next, a method of manufacturing the wafer supporting members 2 will be explained. Prepared first is a stick-like base material of quartz. The base material of quartz prepared has no grooves 5 yet. The grooves 5 are formed by using a diamond cutter, for example.

Figure 14:
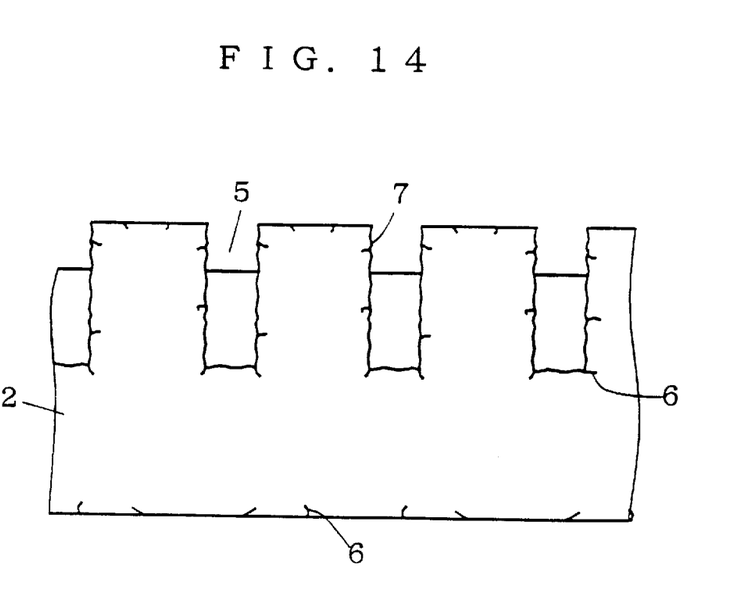
FIG. 14 is a sectional view showing conditions of micro cracks and chippings.

FIG. 14 shows a section of the wafer supporting member 2 after the grooves are formed with a diamond cutter. In this stage, there are micro cracks 6 and abrasions 7 of about 10 $\mu$m in the surface of the wafer supporting member 2.

Figure 15:
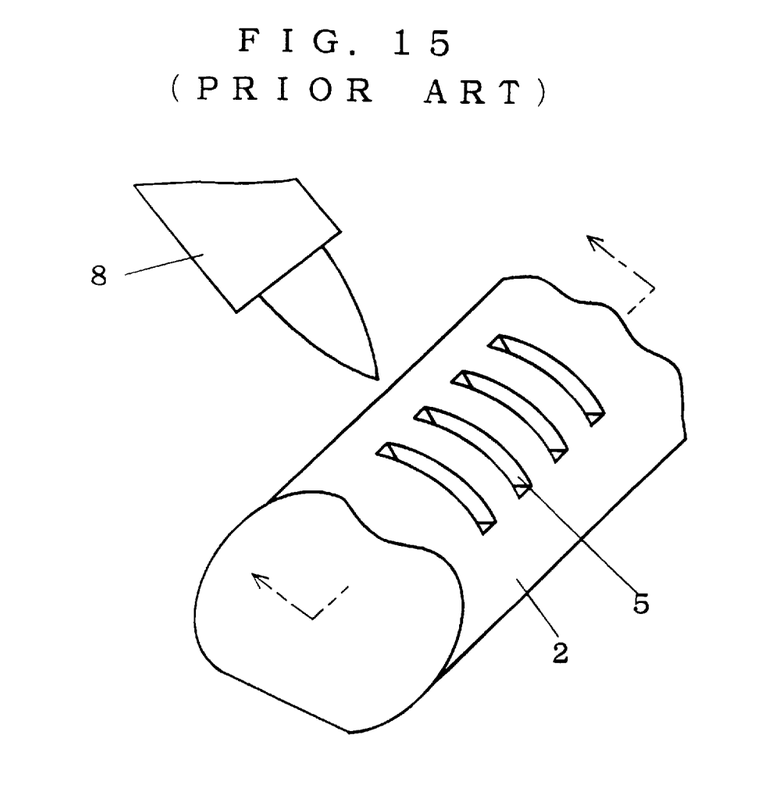
FIG. 15 is a block diagram illustrating a conventional method of manufacturing the CVD jig.
Figure 16:
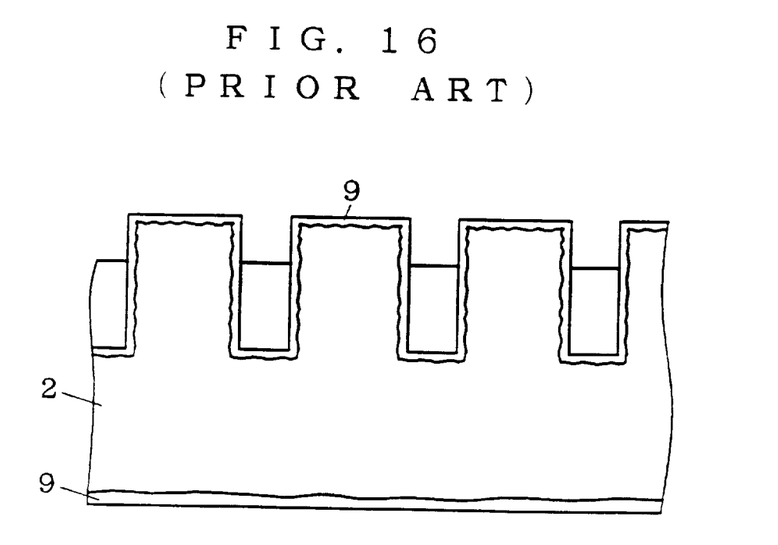
FIG. 16 is a sectional view showing the structure of the conventional wafer supporting member.

Conventionally, as described in Japanese patent Laying-Open Gazette No.52-45260, the surface of the wafer supporting member 2 is directly burned with a flame of an oxyhydrogen burner 8 shown in FIG. 15 so that the surface of the wafer supporting member 2 melts and the micro cracks 6 and the abrasions 7 disappear. Since the temperature of the flame of the oxyhydrogen burner 8 reaches as high as 2000° C., the trace of the flame is rapidly cooled and therefore rehardened and an affected layer 9 is formed as shown in FIG. 16. The affected layer 9 is formed of quartz having a different crystal structure than the base material, which can be observed by the following methods. For example, it can be observed by using a polarizing microscope, or a scanning electron microscope utilizing the difference in etching and cleavage properties, or the Fourier transform infrared spectroscopy (FT-IR).

Next, a film formation process by the low pressure CVD using the CVD jig will be explained referring to FIG. 17.

First, in Step ST1, wafers are placed on the quartz boat 1 shown in FIG. 12. In Step ST2, the quartz boat 1 is placed in a certain position in a CVD device.

In Step ST3, gases are introduced into the CVD device to expose the wafers, together with the quartz boat 1, to a desired atmosphere to form a film on the surfaces of the wafers. A film is also formed on the surface of the quartz boat in the film formation process. Since the conditions for the thin film formation require temperatures as high as 500°–800° C., for example, and it is necessary to prevent contamination of the wafers, quartz glass or ceramics are used as the material of the boat.

In Step ST4, the wafers having the films are taken out together with the quartz boat 1. At this time, it is determined whether it is necessary to remove the film formed on the surface of the quartz boat 1 (Step ST5). This determination in Step ST5 is made not only by directly observing the surface condition of the quartz boat 1 but also by considering indirect conditions, such as the integrated number and integrated time of the film formation processes.

If it is determined in Step ST5 that a film removing treatment is not required, the process returns to Step 1 to continue the film formation process. When it is determined that the film must be removed, however, the quartz boat 1 is dipped into a cleaning chemical such as hydrofluoric acid, hydrochloric acid, nitric acid, or the like, to remove the film attached to the surface of the quartz boat.

The conventional CVD jig, the low pressure CVD method using it, and the method of manufacturing the CVD jig are structured as explained above. Since the jig is burned with an oxyhydrogen burner to prevent frosting and cracks, the OH concentration in the quartz glass is increased. This is due to the fact that in the conventional melting process with an oxyhydrogen burner 8, hydrogen and quartz in the wafer supporting member 2 react to produce $SiO_a(OH)_b$. Where "a" is larger than 0 and smaller than 2, or "b" is larger than 0 and smaller than 4, and the relation 2a+b=4 is satisfied. When hydrofluoric acid (HF) is used as a cleaning chemical, for example, the reaction shown in the formula 2 proceeds faster than that shown in the formula 1. Hence, it becomes more susceptible to corrosion than the case of a lower OH concentration. Then the surface conditions of the quartz are deteriorated to cause dust, which reduces the yield when semiconductor devices are mass-produced by using this kind of jigs.

$$SiO_2 + HF \rightarrow SiF_4 + H_2O \qquad (1)$$
$$(SiH_2F_6)$$

$$\begin{matrix}Si(OH)_4\\SiO_2 \cdot 2H_2O\end{matrix} + HF \rightarrow SiF_4 + H_2O \qquad (2)$$
$$(SiH_2F_6)$$

Especially, in recent years, for the purpose of removing the films attached on the surfaces, the CVD jigs are often treated in a vapor phase by using a cleaning chemical of chlorine trifluoride ($ClF_3$), nitrogen trifluoride ($NF_3$), for example. This brings about more serious deterioration of the surface conditions of the CVD jigs made of quartz.

Figure 18:
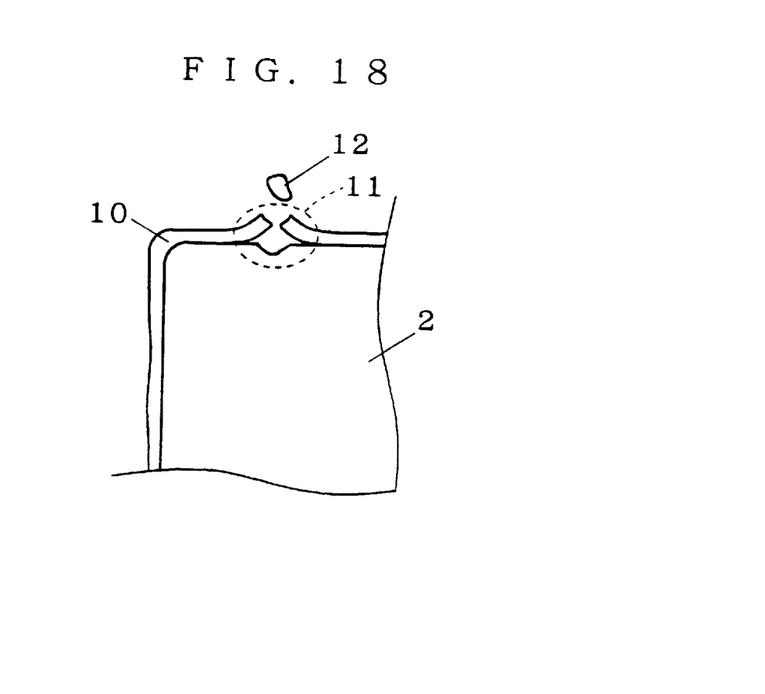
FIG. 18 is a diagram conceptually showing the mechanism of occurrence of dust.
Figure 19A:
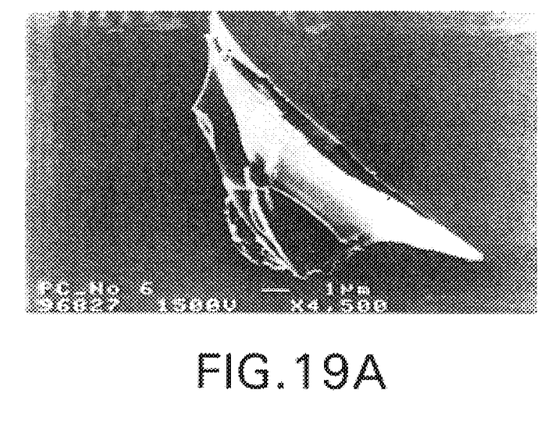
FIGS. 19A and 19B show pictures of the dust taken with a scanning electron microscope.
Figure 19B:
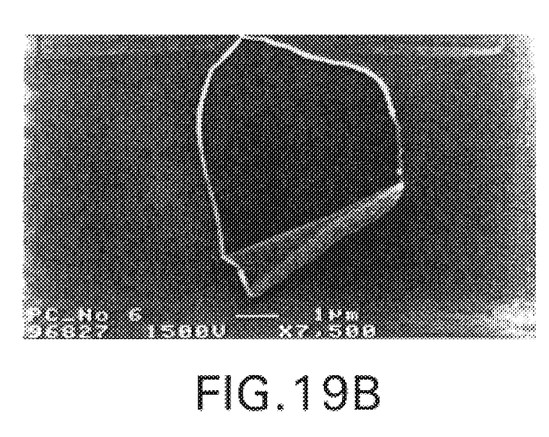
Figure 20:
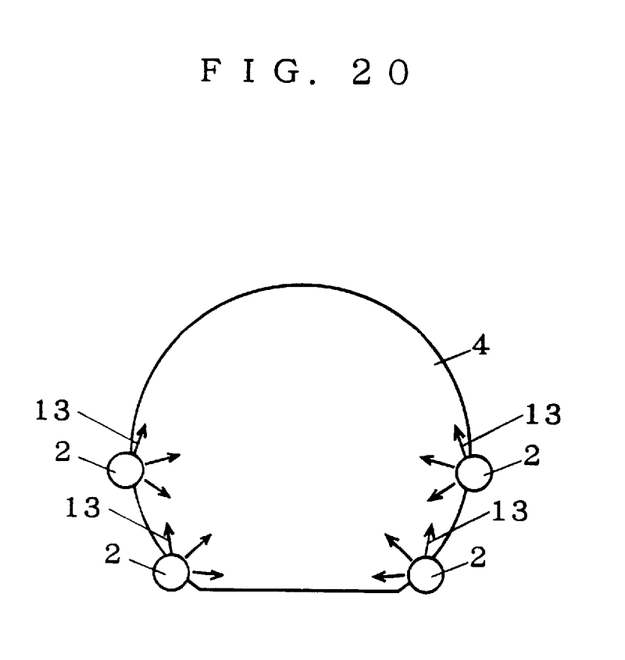
FIG. 20 is a diagram conceptually showing the dust coming off from the CVD jig.

FIG. 18 is a diagram showing occurrence of dust, wherein the film 10 formed on the surface of the wafer supporting member 2 comes off in the region 11 to be a piece of dust 12. FIGS. 19A and 19B provide pictures of the dust 12 taken with a scanning electron microscope. These pictures show that the dust have a size of about several micrometers. Since the thickness of the film is less than 1 $\mu$m, it is seen that the quartz has come off together with the film. FIG. 20 is a side view of a section showing the relation between the wafer 4 and the wafer supporting members 2. The dust comes off from the wafer supporting members 2 and scatters along the tracks shown by the arrows 13. However, note that a plurality of pieces of dust do not always occur at the same time. Only one may occur, or most probably, no dust will occur at all. However, the quartz comes off in repeated use and then the quartz jig can not be used many times.

The difference between the coefficient of linear expansion of the attached film 10 and that of the quartz glass forming the wafer supporting member 2 also contributes to the dust. Table 1 shows the coefficients of linear expansion of materials under the same conditions as to the number of applications and the number of cleanings. As the difference in the coefficients of linear expansion increases, and as the difference in temperature for film formation increases, the film 10 comes off more frequently.

While Table 1 shows the values with bulk materials, films formed by CVD generally provide larger values.

TABLE 1

| Material | SiO$_2$ | Si | C | SiN | SiC | AlN | Al$_2$O$_3$ |
|---|---|---|---|---|---|---|---|
| Coef of linear expansion × 10$^{-6}$/deg. | 0.5 | 2.2–2.4 | 3.2 | 3.4 | 4.3 | 4.5 | 8.0 |

Note:
SiO$_2$...quartz,
Si...silicon,
C...carbon,
SiN...silicon nitride,
SiC...silicon carbide,
AlN...aluminum nitride,
Al$_2$O$_3$...alumina.

Note: SiO$_2$ ... quartz, Si ... silicon, C ... carbon, SiN ... silicon nitride, SiC ... silicon carbide, AlN ... aluminum nitride, Al$_2$O$_3$ ... alumina.

SUMMARY OF THE INVENTION

According to a first aspect of the present invention, in a jig made of quartz for use in CVD on which a wafer is placed and exposed in a certain atmosphere when forming a film, an OH concentration of a quartz surface in and around a wafer supporting portion of said jig is suppressed to 30 ppm or lower.

Preferably, according to a second aspect of the present invention, the CVD jig comprises a base made of quartz, a plurality of shelf-like protrusions made of quartz and protruding from the base, and projections made of quartz each formed on one main surface of each of the plurality of shelf-like protrusions for supporting the wafer.

Preferably, according to a third aspect of the present invention, an affected layer is removed from the quartz surface so that a base material of quartz having an OH concentration of 30 ppm or lower is exposed in the quartz surface.

Preferably, according to a fourth aspect, the quartz surface corresponds to an inner wall of a groove formed to support the wafer and the groove has an approximately V-shaped section.

Preferably, according to a fifth aspect, the quartz surface corresponds to an inner wall of a groove formed to support the wafer and the groove is obliquely formed.

According to a sixth aspect of the present invention, a method of manufacturing a jig for use in CVD comprises the steps of preparing a base material of quartz processed into a desired shape, and cutting the base material of quartz with a cutter having a cutting edge moving at a speed of 20 meters per second or higher to form a groove.

Preferably, according to an seventh aspect, in the step of forming a groove in the CVD jig manufacturing method, the cutting edge of the cutter has a body of rotation which has an approximate V shape in a cross section.

Preferably, according to a eighth aspect of the present invention, forming a groove in the CVD jig manufacturing method, the cutter obliquely cuts the base material of quartz.

According to a ninth aspect of the present invention, a method of manufacturing a jig for use in CVD comprises the steps of processing a base material of quartz into a desired shape fitted to support a wafer, hot-melting a surface of the processed base material of quartz, and removing an affected layer on the surface of the base material of quartz.

As explained so far, according to the CVD jig of the first aspect, an OH concentration in the quartz surface is suppressed to 30 ppm or lower to provide improved resistance to corrosion by acid. This allows the jig to be used for an increased number of times. This also provides the effect of reducing dust in the film formation process when the jig is cleaned for the same number of times.

According to the CVD jig of the second aspect, a wafer is supported only on the quartz projection. The wafer is thus brought into contact with or placed close to the jig in a smaller area. This allows less dust from the jig to attach to the wafer on the way back.

According to the CVD jig of the third aspect, the affected layer is removed from the surface of the quartz. This prevents the surface from becoming like frosted glass or from cracking due to differences in characteristics between the affected layer and the base material of quartz.

According to the CVD jig of the fourth aspect, the wafer is supported on the inner wall of the approximately V-shaped groove on a line or at a point. This provides the effect of reducing the contact area between the wafer and the inner wall of the groove to allow a smaller amount of dust to attach to the wafer. Furthermore, since stresses do not concentrate on the boundary between the inner wall of the groove and the surface in which the groove is formed when a film is formed on the surface of the CVD jig, the film is less liable to come off.

According to the CVD jig of the fifth aspect, the wafer is supported on the inner wall of the obliquely formed groove on a line or at a point. This provides the effect of reducing the contact area between the wafer and the inner wall of the groove so as to allow less dust to attach to the wafer.

According to the method of manufacturing a CVD jig of the sixth aspect, it is possible to reduce micro cracks and the like when forming grooves with a cutter. This provides the effect of eliminating the necessity of the process step of melting the surface of the base material of quartz, for example, to prevent deterioration of the corrosion resistance of the CVD jig.

According to the method of manufacturing a CVD jig of the seventh aspect, it is possible to obtain a groove having a wall surface with fewer defects like micro cracks and also having an approximate V shape in a cross section.

According to the method of manufacturing a CVD jig of the eighth aspect, it is possible to obtain an obliquely formed groove having a wall surface with fewer defects like micro cracks.

According to the method of manufacturing a CVD jig of the ninth aspect, the base material of quartz is exposed. Accordingly, even if the OH concentration in the affected layer is increased, it is possible to take advantage of the corrosion resistance of the base material of quartz as the corrosion resistance of the CVD jig irrespective of the deterioration of the corrosion resistance of the affected layer.

The present invention has been made to solve the problems described above, and it is an object to provide a CVD jig formed of quartz resistant to cleaning chemicals while avoiding frosting and cracks.

The frosting herein means the phenomenon in which the surface is made like a frosted glass by acid, rather than that in which quartz is reduced by hydrogen H$_2$ to become white.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
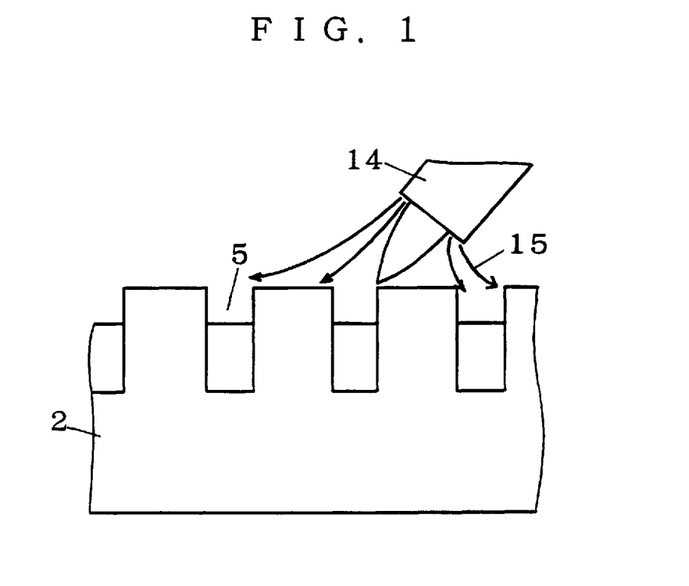
FIG. 1 is a block diagram illustrating a method of manufacturing a CVD jig according to a first preferred embodiment.

A method of manufacturing a jig for use in CVD according to a first preferred embodiment of the present invention will now be explained referring to the drawings. FIG. 1 is a block diagram illustrating a process step for manufacturing a CVD jig according to a first preferred embodiment. The surface of the wafer supporting member 2 is melted by using an arc plasma torch 14 of FIG. 1, e.g., a TIG (Tungsten Inert Gas) torch, in place of the oxyhydrogen burner 8 shown in FIG. 15. In order to prevent metal contamination of the wafers used as substrates for semiconductor devices, it is necessary to prevent metal contamination of the CVD jig. It is therefore desirable to use a refractory metal such as tungsten for the part of the torch which reaches high temperature in use, especially, for the internal electrodes. The arc plasma torch is described in "Electro-Heat Handbook," (Japan Electro Heat Association), Ohm Sha, pp. 151–154, 1990, for example.

In order to prevent metal contamination of the plasma from the electrodes, it is desirable to use the alternating current and to use electrodes covered with ceramics or the like to prevent sputtering.

When the surface of the wafer supporting member 2 is melted to eliminate micro cracks and abrasions, the atmosphere therearound is replaced by an argon gas Ar coming from the arc plasma torch. Accordingly, no hydrogen acts on the quartz, and therefore the OH concentration in the quartz is not increased. The OH concentration was measured by using FT-IR.

This manufacturing method provides OH concentrations of 30 ppm or lower in the surface of the quartz, which provides improved corrosion resistance. Such a CVD jig made of quartz is less susceptible to surface deterioration by cleaning chemicals. This lessens frosting and cracks, and hence dust, as compared with conventional ones. Accordingly, film formation by low pressure CVD by using this CVD jig will provide improved yield when manufacturing semiconductor devices.

The use of the CVD jig of the first preferred embodiment is especially effective when the CVD jig is cleaned for film removal in a vapor phase by using chlorine trifluoride ($ClF_3$) or nitrogen trifluoride ($NF_3$) as a cleaning chemical, for example, for the CVD jig is less susceptible to corrosion by these cleaning chemicals than conventional ones.

Although the surface is melted with argon plasma from the arc plasma torch 14 in the implementation of the first preferred embodiment, use of other gases, such as nitrogen gas, provides the same effects, as long as no hydrogen gas or water vapor is introduced. It is desirable to replace the atmosphere itself in which the arc plasma torch 14 is used with argon gas or the like.

Figure 2:
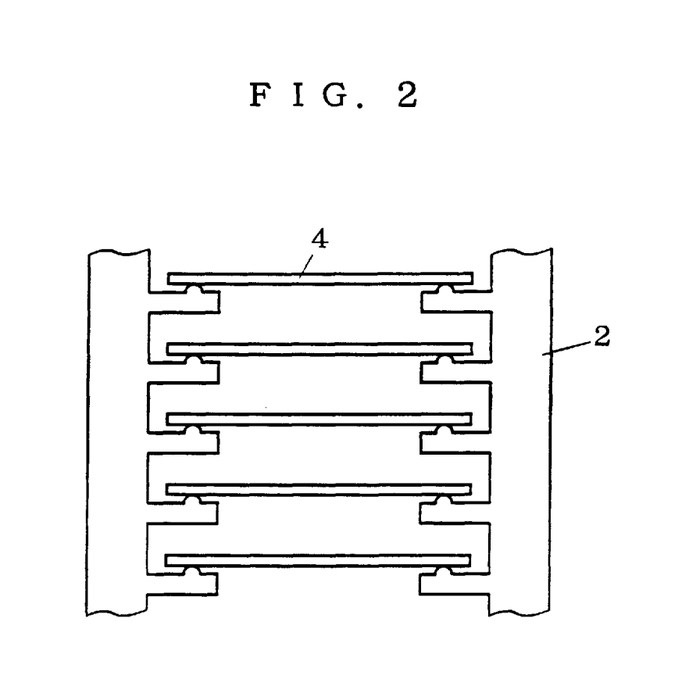
FIG. 2 is a sectional view showing the relation between wafers and a CVD jig which supports the wafers at points.
Figure 3:
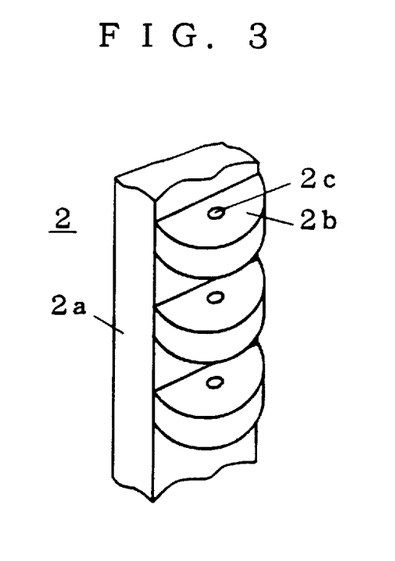
FIG. 3 is a perspective view showing the structure of the CVD jig of FIG. 2.

Such a wafer supporting member 2 as shown in FIG. 2 may be used to support wafers in point contact. FIG. 3 is a perspective view of the wafer supporting member shown in FIG. 2, which shows that the projections 2c for supporting wafers are each formed on one main surface of each of the plurality of shelf-like protrusions 2b protruding from the body 2a of the wafer supporting member 2.

Figure 4:
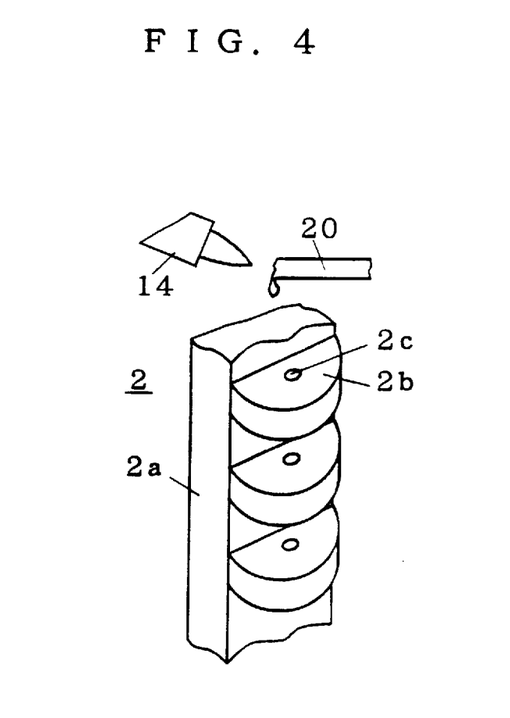
FIG. 4 is a block diagram showing a process for forming the projections shown in FIG. 3.

The projections 2c are formed, as shown in FIG. 4, by melting a quartz stick 20 with the arc plasma torch 14 and applying the drops onto one main surface of each protrusion 2b, for example. Although this method is the same as conventional ones in that the melted quartz is used to form the projections 2c, the use of the arc plasma torch 14 provides reduced OH concentration in the projections 2c. Since the entirety of each projection 2c is melted, the use of the arc plasma torch 14 remarkably provides the effect of preventing deterioration of the projections 2c due to cleaning chemicals.

Second Preferred Embodiment

Figure 5:
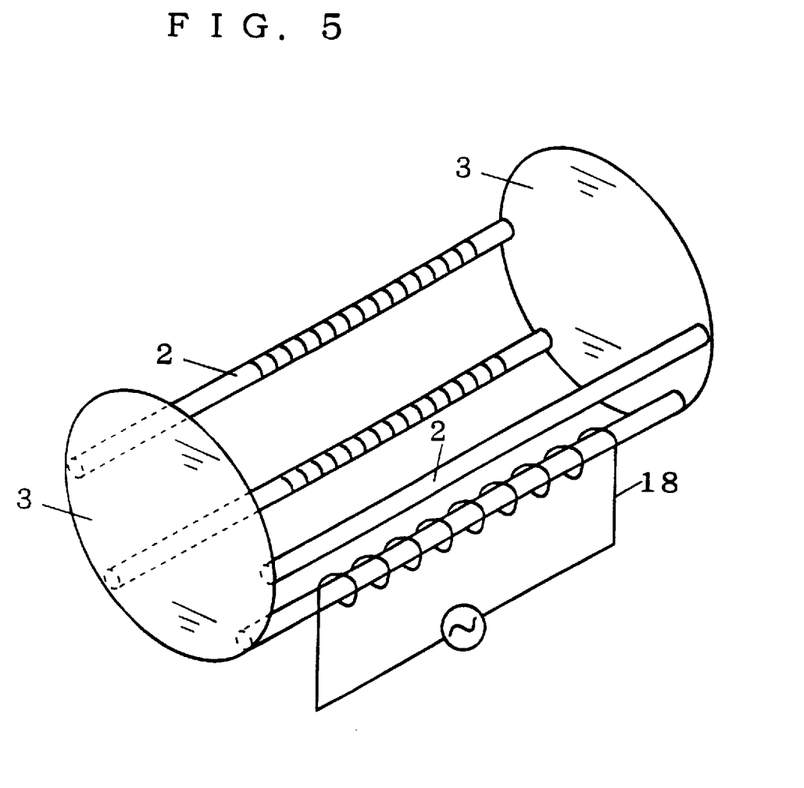
FIG. 5 is a perspective view illustrating a method of manufacturing a CVD jig according to a second preferred embodiment.

Next, a method of manufacturing a jig for use in CVD according to a second embodiment of the present invention will be explained referring to the drawing. FIG. 5 is a perspective view for illustrating a process step for manufacturing a CVD jig of a second preferred embodiment of the present invention. In FIG. 5, the surface of a wafer supporting member 2 is melted in an atmosphere of nitrogen, for example, with a heater 18 wound, not in contact, around the wafer supporting member 2 fixed to quartz plates 3.

Although the method of manufacturing the CVD jig of the first preferred embodiment uses an arc plasma torch, the surface of the wafer supporting member 2 may be melted with the electric heater 18 in an atmosphere containing no hydrogen, in place of being directly fired, to provide the same effects.

Third Preferred Embodiment

Figure 6:
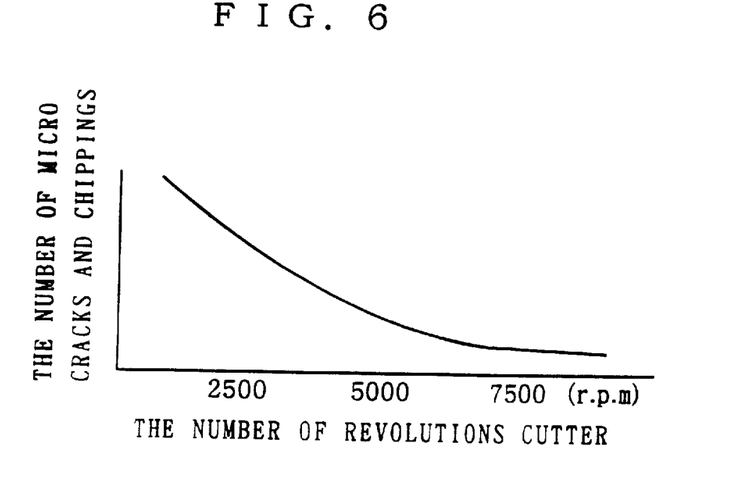
FIG. 6 is a graph showing the relation between the number of revolutions of the cutter and the micro cracks.

Next, a method of manufacturing a jig for use in CVD according to a third preferred embodiment of the present invention will be explained referring to the drawings. A diamond cutter having a diameter of about 3 to 5 cm is used to form the grooves 5 shown in FIG. 13, for example. As the grooves are formed by using a cutter, the cutting edge of the cutter impacts on the base material of quartz to cause micro cracks and the like in the surface of the base material, leading to frosting and larger cracks. FIG. 6 provides a graph showing the relation between the number of revolutions (rpm) of a cutter used to manufacture the CVD jig of the second preferred embodiment of the present invention and the number of micro cracks and chippings. Conditions other than the number of revolutions, such as the diameter of the cutter (about 5 cm), were set equal. The number of micro cracks and chippings shows how many micro cracks and chippings were formed per unit length at the top and bottom corners of the groove 5, which were measured by eyes, or by using a magnifier, or a microscope.

As can be seen from this graph, the number of micro cracks and chippings can be reduced by increasing the number of revolutions of the cutter. Experiments have revealed that speeds of about 7500 rpm or higher are practical to use the surface of the base material of quartz as it is without melting.

It is thus preferable that the cutting edge of the cutter impacts on the quartz at a speed of 20 m/s or higher (7500 rpm or higher with a cutter of a diameter of about 5 cm). In this case, the process of melting the surface of the base material of quartz, which has been necessary in conventional methods, can be eliminated. Similarly to the first preferred embodiment, this suppresses frosting and cracks in the surface of the jig due to cleaning chemicals as compared with conventional ones, to increase the yield when forming films by low pressure CVD. While the feed rate of the cutter is set constant to about 5 millimeters per second, for example, the lower the feed rate is, the smaller the number of chippings is.

The number of revolutions of the diamond cutter can be increased by using inverter control, an air turbine, or a gear, which can easily be realized with existing technique. The processing with a cutter rotating at a high speed may be followed by the surface melting step of the first or second preferred embodiment, in which case the surface can be lightly melted to simplify the production.

Figure 7:
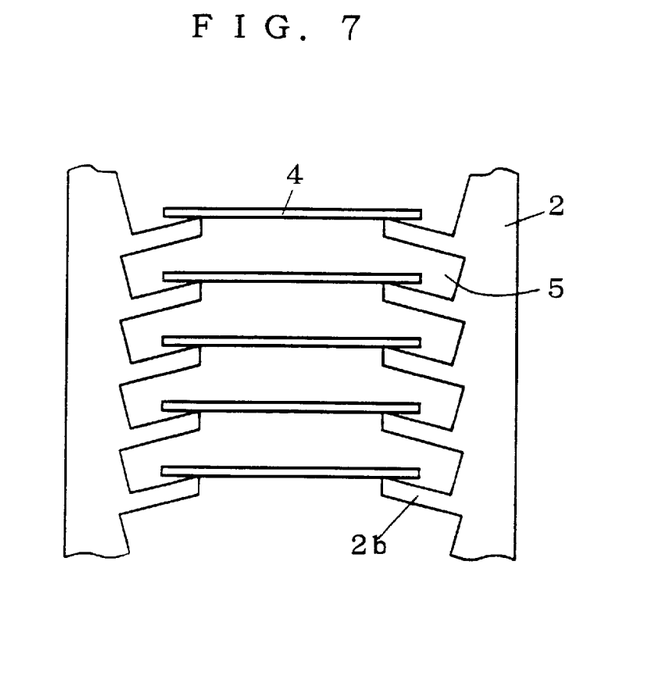
FIG. 7 is a sectional view of a wafer supporting member obliquely cut by the cutter.

The edge of the diamond cutter may be obliquely inserted into the base material of quartz to form slanting grooves 5, as shown in FIG. 7. Obliquely forming the grooves 5 reduces the contact area between the wafers 4 and the shelf-like protrusions 2b supporting them. In this case, even if dust comes off from the protrusions 2b, they less possibly attach to the wafers 4, which further increases the yield of semiconductor devices manufactured by using the CVD jig. Although the effects of micro cracks formed by a cutter will somewhat increase when the surface of the wafer supporting member 2 is not melted, reducing the contact area between the wafers 4 and the wafer supporting members 2 will reduce the effects.

Figure 8:
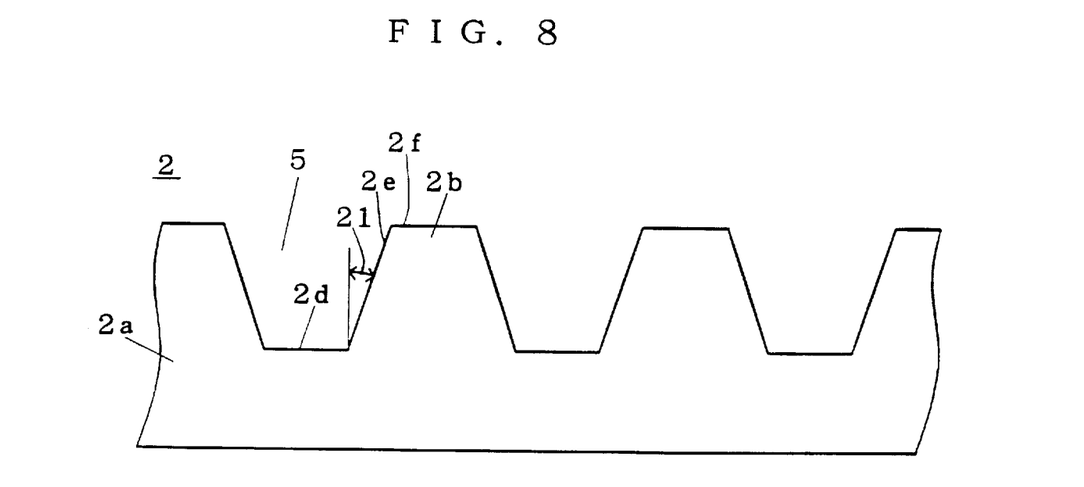
FIG. 8 is a sectional view of a wafer supporting member cut by a cutter having a cutting edge of a different shape.

Such approximately V-shaped grooves 5 as shown in FIG. 8 can be formed by cutting the base material of quartz with a diamond cutter whose rotating edge is a body of rotation having a trapezoidal form with a shorter base in a cross section. That is to say, the base of the trapezoid of the sectional rotating edge corresponds to the bottom 2d of the groove 5 and an oblique side of the trapezoid corresponds to the side wall 2e of the groove 5. Since a wafer is horizontally supported on the side wall 2e of the groove 5, the angle shown at the numeral 21 corresponds to the angle between the wafer and the inner wall 2e of the groove 5. The wafer thus comes in contact with the inner wall 2e of the groove 5 at a point or on a line and hence is less subject to dust from the inner wall 2e of the groove 5, or one main surface of the protrusion 2b. Furthermore, the surfaces forming the groove 5 intersect at obtuse angles, which facilitates cleaning and firing finish. It also provides the effect of preventing the exfoliation since stresses of the film attached to the wafer supporting member 2 do not concentrate upon the boundary between the inner wall 2e of the groove 5 and the surface 2f of the wafer supporting member 2.

Figure 9:
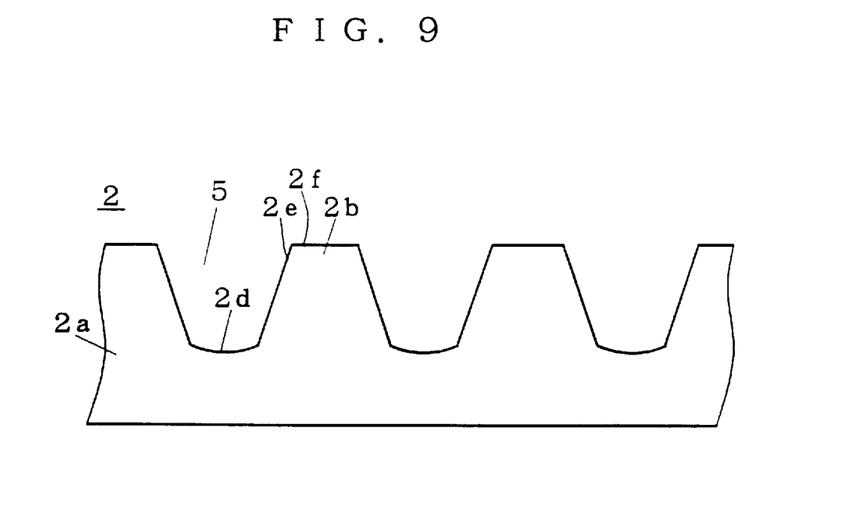
FIG. 9 is a sectional view of a wafer supporting member cut by a cutter having a cutting edge of a different shape from that in FIG. 8.

When forming similar V-shaped grooves 5, the bottoms 2d of the grooves 5 may be U-shaped or may be shaped like semicircles in sections as shown in FIG. 9 to provide the same effects as the structure shown in FIG. 8.

Fourth Preferred Embodiment

Figure 10:
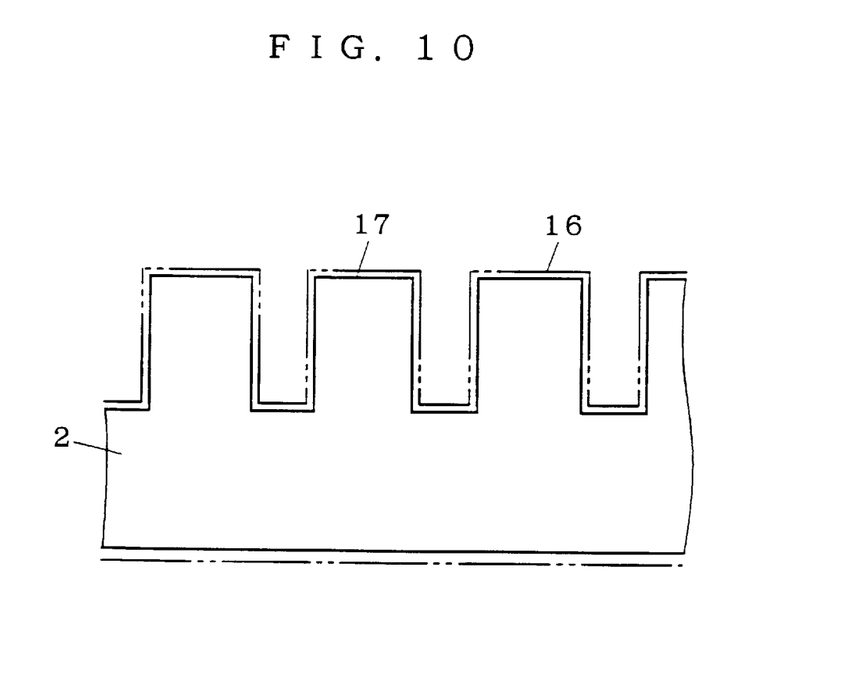
FIG. 10 is a sectional view of a wafer supporting member according to a fourth preferred embodiment.

Next, a method of manufacturing a jig for use in CVD according to a fourth preferred embodiment of the present invention will be explained referring to the drawings. In the conventional manner, the surface of the wafer supporting member 2 made of quartz is melted with an oxyhydrogen burner 8 as shown in FIG. 15 to prevent frosting and cracks. This increases the OH concentration in the affected layer 9 shown in FIG. 16 to decrease the resistance to corrosion by cleaning chemicals. In this case, the OH concentration is high in the affected layer 9 but remains unincreased in the inside of the base material of quarts under the affected layer 9. Accordingly, as shown in FIG. 10, removing the affected layer 9 by sandblasting, for example, will provide a CVD jig having no micro cracks and having excellent corrosion resistance. In FIG. 10, the two-dot chain line shown at the numeral 16 shows the surface of the wafer supporting member 2 before sandblasting, and the solid line shown at the numeral 17 shows the surface of the wafer supporting member 2 after sandblasting. Thus the layer ground away by sandblasting has a thickness larger than the affected layer.

The sandblasting is performed by blowing about 300- to 1000-mesh quartz beads or ceramics beads onto the wafer supporting member 2 with a high-pressure air of about 5 to 10 atm. A higher count of mesh indicates a smaller particle size of the beads, and beads with a smaller particle size do less damage to the quartz. In this blowing process step, the beads may be intermittently blown onto the quartz, or other processing steps may be inserted between a plurality of blowing process steps.

It is possible to confirm that the affected layer 9 has been removed from the wafer supporting member 2 by observing it with a polarizing microscope or by observing with a scanning electron microscope. It is possible to obtain CVD jigs having no affected layer by determining, by such observation, conditions of sandblasting, such as a time, and processing according to the conditions, without observing with a microscope every time.

If the sandblasting is performed without melting the surface, micro cracks may become more serious, rather than disappear. Accordingly, it is necessary to once fire and melt the surface with an oxyhydrogen burner or a plasma torch.

In this case, as well, the use of the arc plasma torch of the first preferred embodiment offers advantages in terms of reducing the OH concentration. The use of a diamond cutter rotating at high speed (7500 rpm or higher) to form the grooves 5 allows the base material of quartz to be shallowly melted, which allows reduction of the sandblasting time.

Instead of sandblasting, other grinding methods or etching may be used. For example, removing the affected layer by etching for about two hours with dilute hydrofluoric acid with a concentration of about 20 wt % will provide the same effects as the embodiment above.

Fifth Preferred Embodiment

Next, a method of manufacturing a jig for use in CVD according to a fifth preferred embodiment will be explained referring to the drawing. Although the jigs are manufactured by using a base material of quartz with an OH concentration of 30 ppm or lower in the preferred embodiments above, the wafer supporting members 2 may be manufactured by using a base material of quartz with an OH concentration of 30 ppm or higher and then reducing the OH concentration.

For instance, it is possible to remove $H_2O$ in the surface of the quartz by annealing the wafer supporting member 2 in an atmosphere of nitrogen at a temperature of 1000°–1050° C. with the electric heater 18 wound around the wafer supporting member 2 as shown in FIG. 5. Removing $H_2O$ in the surface reduces the OH concentration in the surface of the quartz. The temperature for annealing is set to 1000° C. or higher because the OH concentration can not be reduced at temperatures lower than that and it is set to 1050° C. or lower to prevent the quartz from becoming soft to bend.

Since it is originally difficult to obtain low-alkali quartz with low OH concentration, the restrictions by materials can be alleviated by reducing the OH concentration after shaping.

The method of reducing the OH concentration of the fifth preferred embodiment may be applied to the CVD jigs manufactured according to the previously described preferred embodiments to provide the same effects.

Sixth preferred Embodiment

Figure 11:
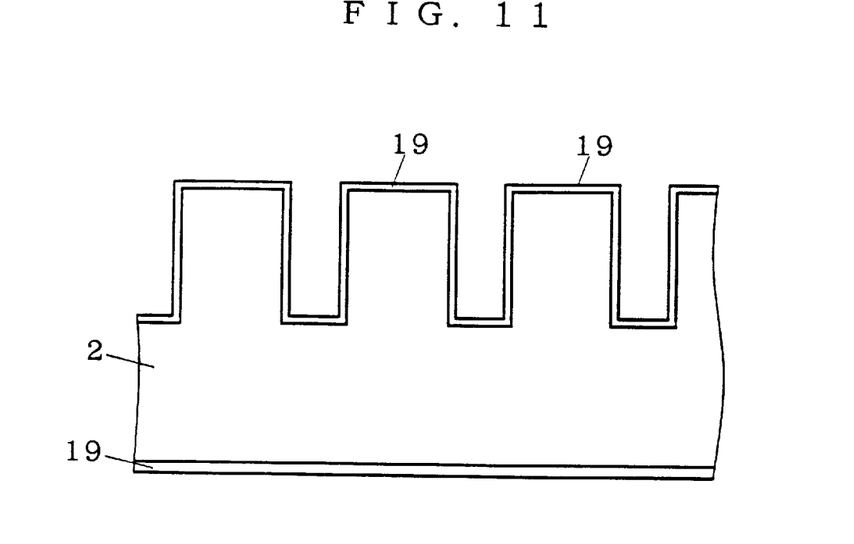
FIG. 11 is a sectional view of a wafer supporting member according to a sixth preferred embodiment.

The structure of a jig for use in CVD of a sixth preferred embodiment will be explained referring to the drawing. FIG. 11 is a sectional view of a CVD jig according to a sixth preferred embodiment of the present invention. In FIG. 11, 19 denotes a coating formed directly on the surface of the wafer supporting member 2 made of quartz. This coating 19 is formed of a silicon compound such as silicon carbide SiC and silicon nitride SiN, or titanium oxide $TiO_2$, or an aluminum compound such as alumina AlO or aluminum nitride AlN, for example. These compounds are less susceptible than quartz to corrosion by cleaning chemicals used to clean the jigs. Accordingly, it is possible to prevent dust coming off from the quartz CVD jig, enabling more repeatable use of the CVD jig. Furthermore, these coatings 19 have coefficients of linear expansion closer to that of the film formed on the wafers than the quartz. The film on the surface of the CVD jig will therefore be less liable to come off.

Considering that the coating may peel off, the coating 19 is formed directly on the surface of the quartz. If the coating comes off, the underlying body of the wafer supporting member 2 and the wafers may come into direct contact. The wafer supporting member 2 is preferably formed of quartz having an OH concentration of 30 ppm or lower because the underlying surface becomes naked when the coating 19 has come off.

When manufacturing the CVD jig of the sixth preferred embodiment by using silicon carbide, it is suitable to form a film by thermal decomposition of organic silicon by CVD or by thermal CVD with a combination of silane system gas such as $SiCl_4$ and hydrocarbon gas such as methane (particularly preferred are gases such as propane and tertiary butane having a larger functional group than methane). When using an aluminum compound such as aluminum nitride AlN or $Al_2O_3$, it is formed by using a combination of $AlCl_3$ or organic aluminum such as ethyl aluminum, and ammonia, or oxidant.

It is also possible to form a film by using thermal spraying, sputtering, ion plating, and the like.

It is preferable, in order to improve the adhesion between the coating 19 and the base material of quartz of the wafer supporting member 2, to form the coating 19 on the base material of quartz after sandblasted as explained in the fourth preferred embodiment.

As another method, aluminum or titanium mixed into the base material of quartz may be oxidized after the wafer supporting member 2 is shaped, so as to form a film 19 containing aluminum oxide or titanium oxide.

The film 19 thus formed is characterized in that it is less liable to peel off than coated ones.

Figure 17:
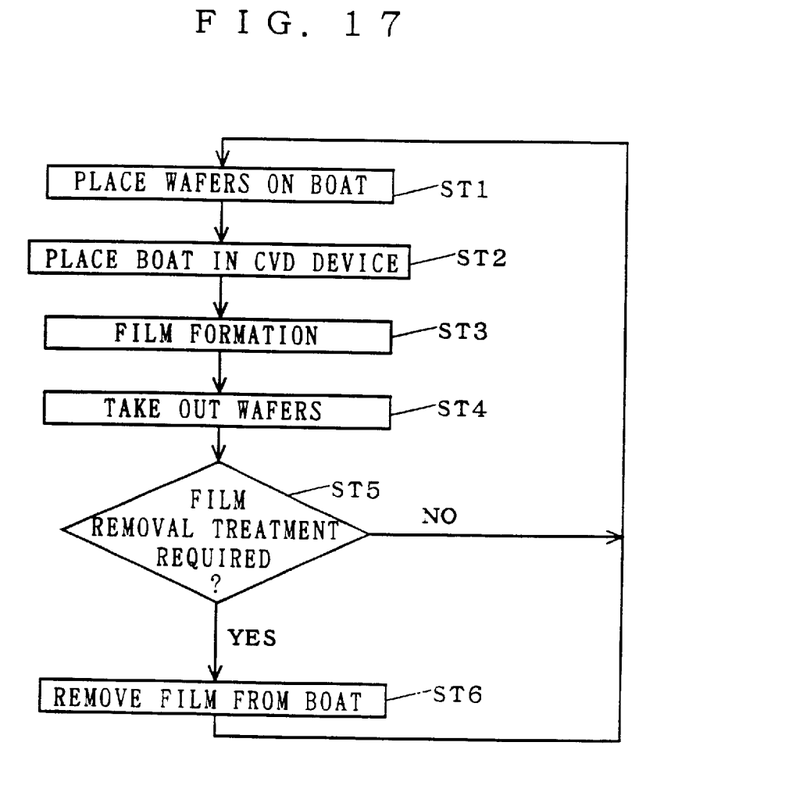
FIG. 17 is a flow chart showing a method of manufacturing a semiconductor device.

The process of forming a film on a plurality of semiconductor devices formed on a wafer can be performed according to the manufacturing procedure shown in FIG. 17 by using the CVD jigs manufactured by the above-described preferred embodiments. In this case, the yield of the semiconductor devices is improved because dust from the CVD jig is reduced. In such production of semiconductor devices, the wafer supporting member can be used in a larger number of applications since the surface thereof is less damaged when cleaned with a cleaning chemical for removal of the film.

Although the above-described embodiments have shown examples in which a plurality of wafers are treated with one CVD jig, the preferred embodiments can be applied to single-wafer treatments as well.

While the invention has been described in detail, the foregoing description is in all aspects illustrative and not restrictive. It is understood that numerous other modifications and variations can be devised without departing from the scope of the invention.

We claim:

1. A jig made of quartz for use in CVD on which a wafer is placed and exposed in a certain atmosphere when forming a film, comprising:

a quartz surface in and around a wafer supporting portion which has been melted and rehardened;

wherein an OH concentration of said quartz surface in and around a wafer supporting portion of said jig, is 30 ppm or lower.

2. The CVD jig according to claim 1 comprising, a base made of quartz, a plurality of shelf-like protrusions made of quartz and protruding from said base, and projections made of quartz each formed on one main surface of each of said plurality of shelf-like protrusions for supporting said wafer.

3. A jig made of quartz for use in CVD on which a wafer is placed and exposed in a certain atmosphere when forming a film, comprising:

a quartz surface in and around a wafer supporting portion which has been melted and rehardened, and which has an OH concentration greater than 30 ppm;

wherein at least a portion of said layer is removed from said quartz surface so that a base material of quartz having an OH concentration of 30 ppm or lower is exposed in said quartz surface.

4. The CVD jig according to claim 1, wherein said quartz surface corresponds to an inner wall of a groove formed to support said wafer and the groove has an approximately V-shaped section.

5. The CVD jig according to claim 1, wherein said quartz surface corresponds to an inner wall of a groove formed to support said wafer and the groove is obliquely formed.

* * * * *